United States Patent
Hara et al.

[11] Patent Number: 5,900,641
[45] Date of Patent: May 4, 1999

[54] FIELD EFFECT SEMICONDUCTOR DEVICE HAVING A REDUCED LEAKAGE CURRENT

[75] Inventors: Naoki Hara, Kawasaki; Shuichi Tanaka, Urayasu; Masahiko Takikawa, Kawasaki, all of Japan

[73] Assignee: Fujitsu Limited, Kawasaki, Japan

[21] Appl. No.: 08/998,894

[22] Filed: Dec. 29, 1997

[30] Foreign Application Priority Data

Jul. 30, 1997 [JP] Japan ................................ 9-205051

[51] Int. Cl.[6] ............... H01L 31/0328; H01L 31/0336; H01L 31/072; H01L 31/109
[52] U.S. Cl. ............... 257/20; 257/24; 257/192; 257/194; 257/195; 257/284
[58] Field of Search ............... 257/20, 24, 192, 257/194, 195, 284

[56] References Cited

U.S. PATENT DOCUMENTS

| | | | |
|---|---|---|---|
| 5,161,235 | 11/1992 | Shur et al. | 257/24 |
| 5,583,355 | 12/1996 | Bernhardt et al. | 257/280 |
| 5,672,890 | 9/1997 | Nakajima | 257/192 |
| 5,739,557 | 4/1998 | O'Neil, II et al. | 257/192 |
| 5,739,558 | 4/1998 | Ishida et al. | 257/192 |
| 5,789,767 | 8/1998 | Omura | 257/194 |

FOREIGN PATENT DOCUMENTS 61-171170  8/1986  Japan ................................ 257/194

*Primary Examiner*—William Mintel
*Attorney, Agent, or Firm*—Armstrong, Westerman, Hattori, McLeland & Naughton

[57] ABSTRACT

A field-effect transistor including a channel layer, a source electrode, a drain electrode, a high-resistance layer provided on the channel layer between the source electrode and the drain electrode and a gate electrode provided in an opening formed in the high-resistance layer, wherein the high-resistance layer is defined by a first side-wall facing the source electrode and a second side-wall facing the drain electrode, such that the first side-wall is separated from the source electrode.

9 Claims, 11 Drawing Sheets

FIELD EFFECT SEMICONDUCTOR DEVICE HAVING A REDUCED LEAKAGE CURRENT

BACKGROUND OF THE INVENTION

1. Field of the Invention

The present invention generally relates to compound-semiconductor devices and, more particularly, to a field-effect compound-semiconductor device in which a gate leakage current is suppressed.

2. Description of the Related Art

Compound-semiconductor devices are semiconductor devices that use a compound-semiconductor material for the active part of the device. Due to the characteristically very small effective mass of carriers in such a compound-semiconductor material, compound-semiconductor devices are used extensively for high speed applications. Such a high speed compound-semiconductor device includes HEMT and MESFET as a representative device, wherein an HEMT or an MESFET is used extensively for high-frequency applications.

In a field-effect compound-semiconductor device for such a high-frequency application, it is desirable to reduce a source resistance thereof as much as possible.

In order to reduce the source resistance of a field-effect compound-semiconductor device, it is desirable to reduce the distance between a source region and a gate electrode as much as possible. However, such a semiconductor device having a reduced source-gate distance tends to show a problem of increased leakage of the current flowing through a cap layer to the gate electrode.

FIG. 1 shows the construction of a typical conventional compound-semiconductor FET (field-effect transistor) 10.

Referring to FIG. 1, the FET 10 is a so-called doped channel transistor constructed on a semi-insulating compound-semiconductor substrate 11, and includes a channel layer epitaxially formed on the substrate 11 by an epitaxial process such as an MOVPE process. On the channel layer 12, there is provided a barrier layer 13 that forms a potential barrier with respect to the channel layer 12 for confining carriers in the channel layer 12, and a spacer layer 14 is formed further on the barrier layer 13 with a thickness adjusted such that the FET 10 has a desired threshold voltage. Further, an etching stopper layer 15 is formed on the spacer layer 14, and a cap layer 16 is provided further on the spacer layer 15.

The cap layer 16 is covered by an insulation film 17, and the insulation film 17 is formed with an opening 16A that penetrates through the cap layer 16, such that a top surface of the etching stopper layer 15 is exposed at the bottom of the opening 16A. It should be noted that the opening 16A is formed in correspondence to a channel region of the FET 10.

On the insulation film 17, there is provided a gate electrode 18 such that the gate electrode 18 fills the opening 16A and achieves direct contact with the etching stopper layer 15, and a pair of $N^+$-type diffusion regions 19A and 19B are formed at both lateral sides of the gate electrode 18, such that the diffusion regions 19A and 19B penetrate through the layers 16–12 and reach the substrate 11. Further, source and drain electrodes 20A and 20B are formed on the cap layer 16 in ohmic contact with the diffusion regions 19A and 19B, respectively.

In the doped channel transistor of FIG. 1, the problem of penetration of a surface depletion layer into the channel layer 12, and resultant repulsion of the carriers therefrom, is successfully avoided. Further, the depth of the opening 16A, in other words, the distance between the channel layer 12 and the gate electrode 18 filling the opening 16A, is set as desired, by providing the etching stopper layer 15. In order to avoid the leakage of the source current to the gate electrode 18, the cap layer 16 is formed of an undoped compound semiconductor material.

In such a doped channel transistor, there inevitably arises a problem in that a substantial gate leakage current flows when the distance between the source region 19A and the gate region 18 is reduced for minimizing the source resistance, particularly when a high gate voltage is applied to the gate electrode 18 for inducing carriers in the channel layer 12. This problem occurs even when the cap layer 16 is formed of a high-resistance undoped compound-semiconductor material.

A similar problem occurs also in a doped channel FET 10' shown in FIG. 2 in which the source and drain electrodes 20A and 20B are disposed at both lateral sides of the cap layer 16 for reducing the distance between the channel layer 12 and the ohmic electrode 20A or 20B.

Summarizing above, conventional compound-semiconductor FETs have suffered from the problem of gate leakage current. In other words, conventional compound-semiconductor FETs could not reduce the source-gate distance as desired because of the gate leakage current and have suffered from the problem of reduced operational speed caused by the source resistance.

SUMMARY OF THE INVENTION

Accordingly, it is a general object of the present invention to provide a novel and useful compound-semiconductor FET wherein the foregoing problems are eliminated.

Another and more specific object of the present invention is to provide a high-speed compound-semiconductor FET having a reduced gate-source distance while simultaneously suppressing a leakage current flowing from a source region of the FET to a gate electrode of the FET.

Another object of the present invention is to provide a field-effect transistor, comprising:

a channel layer transporting carriers therethrough;

a source electrode injecting carriers into said channel layer;

a drain electrode collecting carriers from said channel layer;

a high-resistance layer provided on said channel layer between said source electrode and said drain electrode, said high-resistance layer including an opening in said high-resistance layer; and a gate electrode provided in said opening;

said high-resistance layer being defined by a first side-wall facing said source electrode and a second side-wall facing said drain electrode;

wherein at least said first side-wall is formed with a separation from said source electrode.

Another object of the present invention is to provide a method of fabricating a field-effect transistor, comprising the steps of:

growing a high-resistance semiconductor layer on a layered semiconductor structure epitaxially, said layered semiconductor structure including a channel layer, said high-resistance semiconductor layer being substantially free from dopants;

forming a resist pattern on said high-resistance semiconductor layer so as to cover a channel region of said field-effect transistor;

patterning said high-resistance semiconductor layer while using said resist pattern as a mask, to form a high-resistance pattern defined by a first side-wall and a second, opposite side-wall;

introducing an impurity element into said layered semiconductor body while using said resist pattern as a mask, to form a source region adjacent to said first side-wall and a drain region adjacent to said second side-wall; and forming source and drain regions respectively on said source region and drain region, such that said source region is separated from said first side-wall.

Another object of the present invention is to provide a method of fabricating a field-effect semiconductor device, comprising the steps of:

growing a high-resistance semiconductor layer on a layered semiconductor structure epitaxially, said layered semiconductor structure including a channel layer, said high-resistance semiconductor layer being substantially free from dopants;

forming a resist pattern on said high-resistance semiconductor layer so as to cover a channel region of said field-effect transistor;

introducing an impurity element into said layered semiconductor body while using said resist pattern as a mask, to form, in said layered semiconductor body, a source region at a first side of said resist pattern and a drain region at a second, opposite side of said resist pattern;

patterning, after said step of forming said source and drain regions, said high-resistance semiconductor layer while using said resist pattern as a mask, to form a high-resistance pattern having a first side-wall adjacent to said source region and a second, opposite side-wall adjacent to said drain region; and forming source and drain electrodes respectively on said source and drain electrodes, such that said source electrode is formed with a separation from said first side-wall of said high-resistance pattern.

According to the present invention, the high-resistance layer or high-resistance pattern is separated from the source electrode or the drain electrode, and the leakage current path between the gate electrode and the source electrode is effectively interrupted even in such a case that the distance between the source electrode and the drain electrode, and hence the distance between the source electrode and the gate electrode, is reduced. Thereby, it becomes possible to reduce the source resistance and increase the device operational speed while simultaneously avoiding the leakage current to the gate electrode.

DETAILED DESCRIPTION OF THE PREFERRED EMBODIMENTS

First Embodiment

Figure 3:
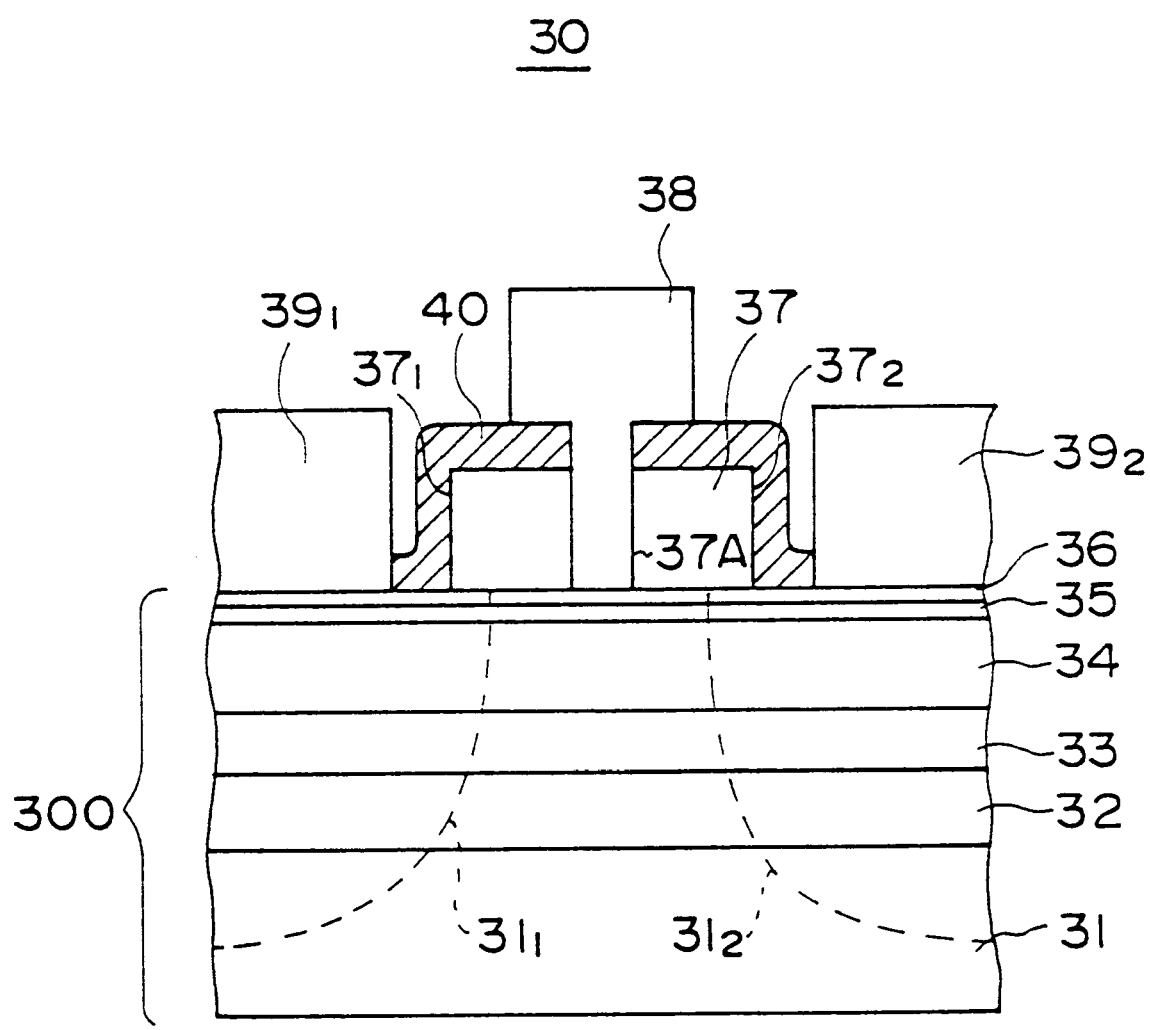
FIG. 3 is a diagram showing the construction of a doped-channel transistor according to a first embodiment of the present invention.

FIG. 3 shows the construction of a doped-channel transistor 30 according to a first embodiment of the present invention.

Referring to FIG. 3, the transistor 30 is formed on a semi-insulating GaAs substrate 31 and includes a layered semiconductor body 300, wherein the layered semiconductor body 300 includes a buffer layer 32 of undoped GaAs formed on the substrate 31 epitaxially with a thickness of about 50 nm, a channel layer 33 of n-type InGaAs formed on the buffer layer 32 epitaxially with a thickness of about 15 nm, a barrier layer 34 of undoped AlGaAs formed on the channel layer 33 epitaxially with a thickness of about 25 nm, a spacer layer 35 of undoped GaAs formed on the barrier layer 34 epitaxially with a thickness of about 10 nm, and an etching stopper layer 36 of undoped AlGaAs formed on the spacer layer 35 epitaxially with a thickness of about 3 nm.

Further, a high-resistance layer 37 of undoped GaAs is formed on the layered semiconductor body 300 epitaxially with a thickness of about 150 nm corresponding to a channel region of the transistor 30 to be formed. It should be noted that the InGaAs channel layer 33 has a composition of $In_{0.2}Ga_{0.8}As$ and doped to a carrier density of $7.5 \times 10^{17} cm^{-3}$, while the AlGaAs barrier layer 34 has a composition of $Al_{0.5}Ga_{0.5}As$. The etching stopper layer 36 has a composition of $Al_{0.25}Ga_{0.75}As$.

Further, the high-resistance layer 37 is defined by a first side-wall $37_1$ and a second, opposing side-wall $37_2$, and a first n-type diffusion region $31_1$ is formed in the foregoing layered semiconductor body 300 at the region adjacent to the side-wall $37_1$ by conducting an ion-implantation process of Si. Similarly, a second n-type diffusion region $31_2$ is formed in the layered semiconductor body 300 adjacent to the second side-wall $31_2$ by an ion implantation process of Si. Thereby, the n-type diffusion region $31_1$ serves for the source region of the transistor 30 while the n-type diffusion region $31_2$ serves for the drain region of the transistor 30. The ion implantation process of Si is conducted in each of the cases of forming the source diffusion region $31_1$ and the drain diffusion region $31_2$, such that the Si atoms thus introduced reach the substrate 31.

In the foregoing high-resistance layer 37, there is provided a contact hole 37A exposing the etching stopper layer 36 underneath, and a gate electrode 38 of Al is provided on the layer 37 such that the gate electrode 38 fills the contact hole 37A.

Further, an ohmic electrode $39_1$ having an AuGe/Ge structure is formed on the layered semiconductor body 300 in correspondence to the diffusion region $31_1$, with a separation from the side-wall $37_1$ of the high-resistance layer 37.

Similarly, an ohmic electrode $39_2$ also having an AuGe/Ge structure is formed on the layered semiconductor body 300 in correspondence to the diffusion region $31_2$, with a separation from the side-wall $37_2$ of the high-resistance layer 37. Thereby, the ohmic electrode $39_1$ serves for a source electrode while the ohmic electrode $39_2$ serves for a drain electrode of the transistor 30. It should be noted that the exposed surface of the high-resistance layer, including the side-walls $37_1$ and $37_2$ are covered by an insulation film 40, which may by formed of $SiO_2$ or SiN.

Figure 1:
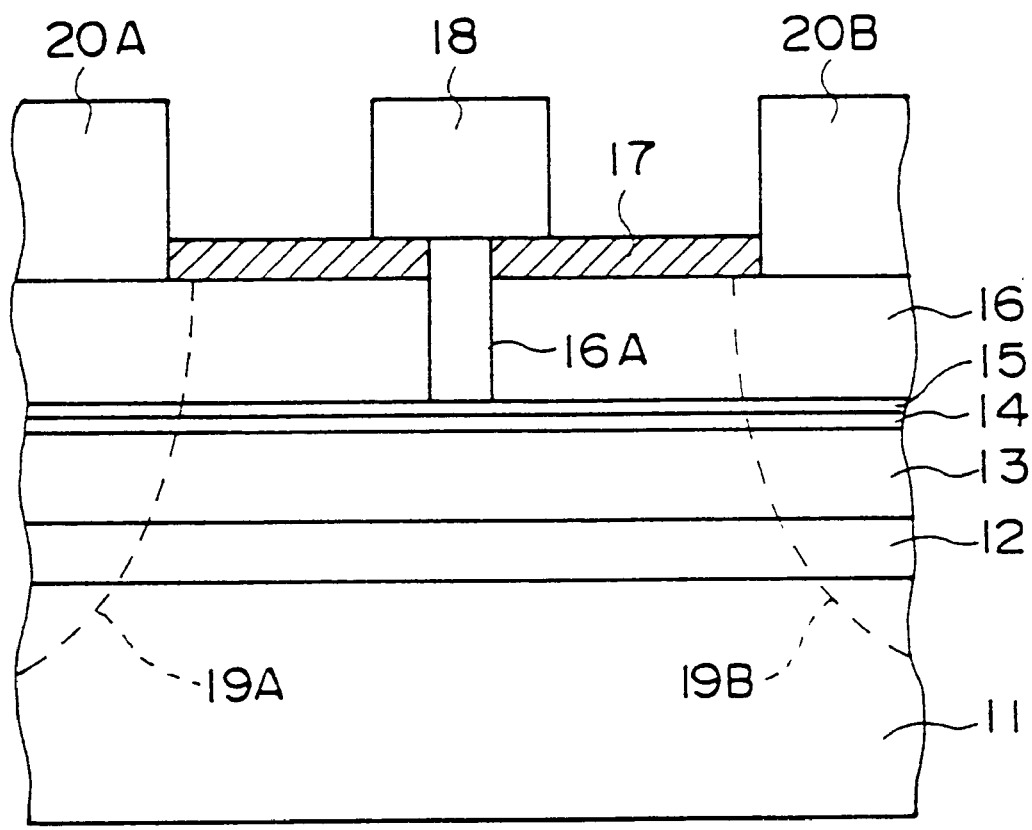
FIG. 1 is a diagram showing the construction of a conventional doped-channel transistor.
Figure 2:
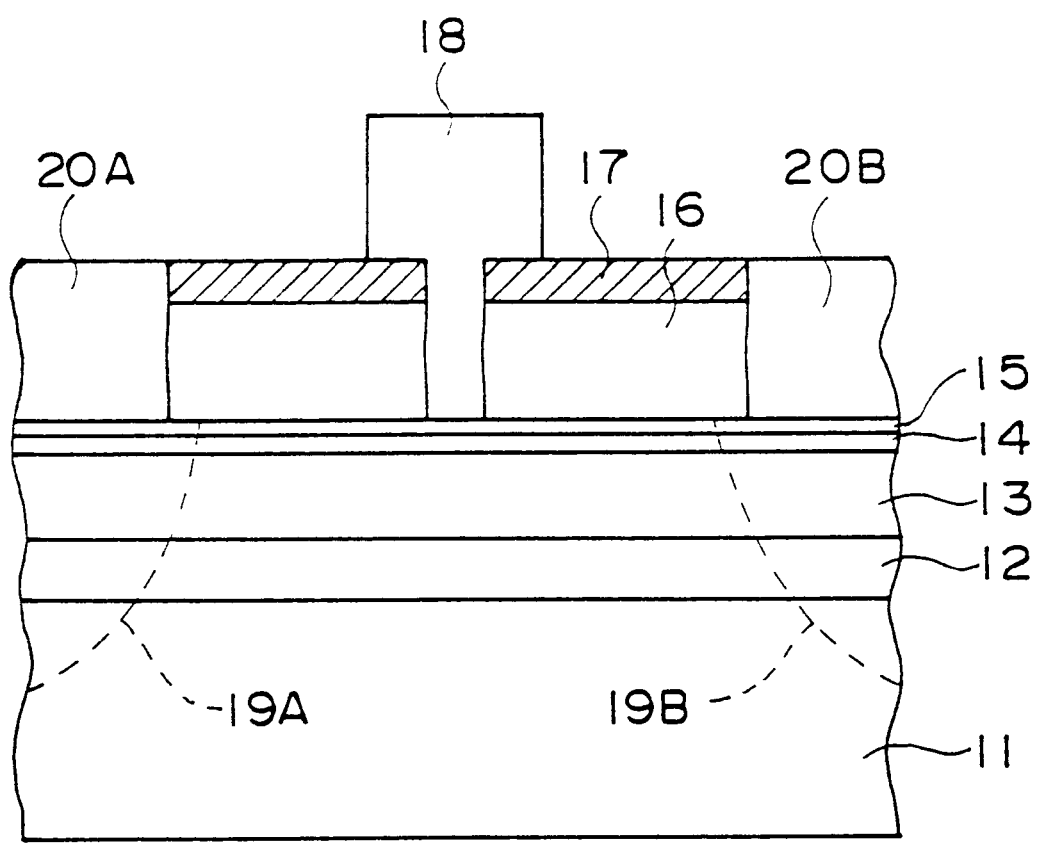
FIG. 2 is a diagram showing the construction of another conventional compound-semiconductor FET.
Figure 4A:
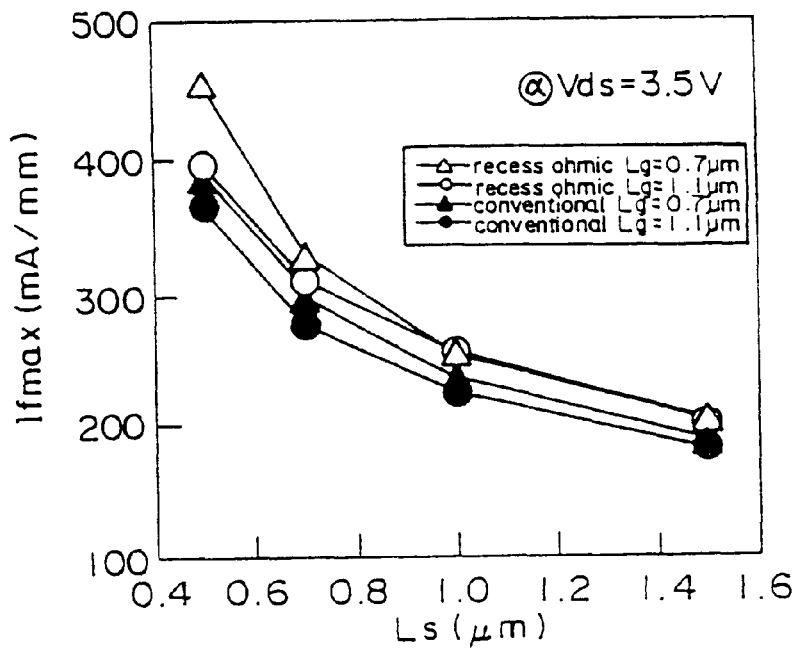
FIGS. 4A and 4B are diagrams showing the operational characteristic of the transistor of FIG. 3 in comparison with that of the transistor of FIG. 1.
Figure 5A:
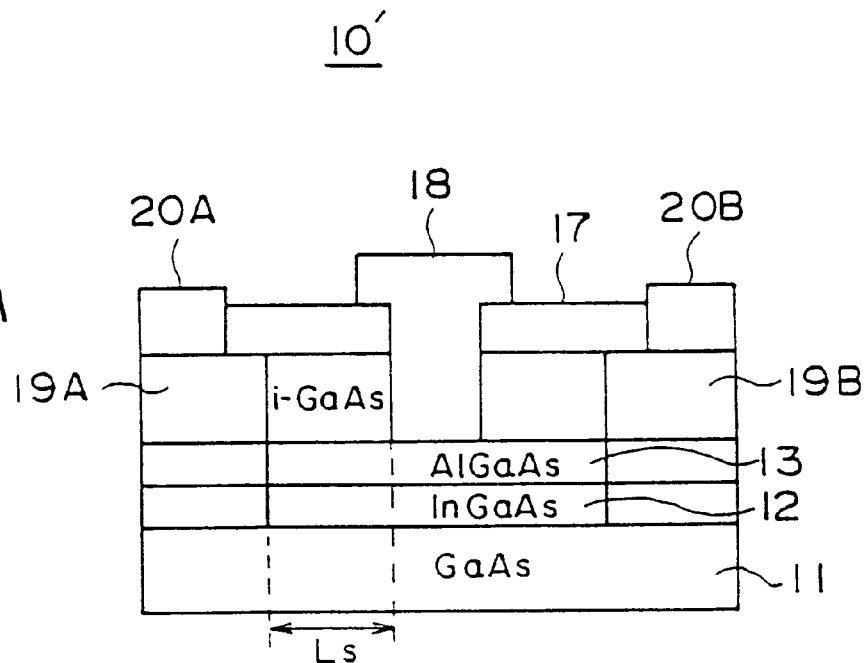
FIGS. 5A and 5B are diagrams showing the definition of a parameter Ls used in FIGS. 4A and 4B.
Figure 5B:
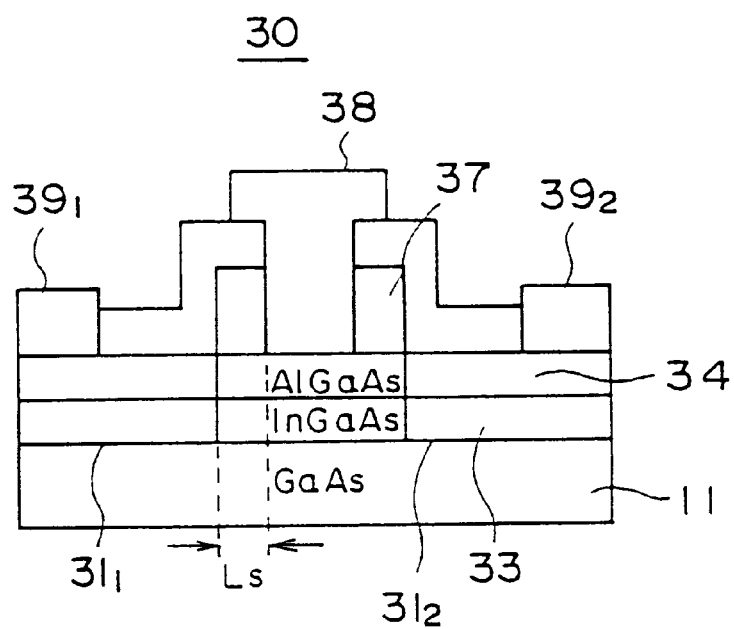

FIG. 4A shows a maximum value $I_{fmax}$ of a source-drain current Ids observed for the transistor 30 for a case of changing a gate-source voltage Vgs from 0 V to 2.5 V while applying a voltage of 3.5 V between the source electrode $39_1$ and the drain electrode $39_2$. FIG. 4A shows the maximum value $I_{fmax}$ of the transistor 30 in comparison with that of the conventional transistor 10. In FIG. 4A, it should be noted that open triangles indicate the result for the transistor 30 of FIG. 3 in which the gate length is set to 0.7 μm, while open circles indicate the result for the same transistor 30 in which the gate length is set to 1.1 μm. Further, solid triangles indicate the maximum value $I_{fmax}$ for the transistor 10 of FIG. 2 in which the gate length is set to 0.7 μm, while solid circles indicate the result for the same transistor 10' in which the gate length is set to 1.1 μm. Further, it should be noted that the horizontal axis of FIG. 4A indicates a distance Ls between the source diffusion region 19A or $39_1$ and the gate electrode 18 or 38 as schematically indicated in FIGS. 5A and 5B. In FIGS. 5A and 5B, it should be noted that the structure of FIG. 5A corresponds to the transistor 10 of FIG. 1, while the structure of FIG. 5B corresponds to the transistor 30 of FIG. 3.

As is apparent from FIG. 4A, the transistor 30 of the present invention shows an increase in the maximum $I_{fmax}$ of the source-drain current Ids, indicating a reduced source resistance of the transistor 30. Further, FIG. 4A indicates that the source resistance decreases with a decrease of the foregoing distance Ls, while no decrease of the source-drain current attributed to the leakage to the gate electrode is observed even when the foregoing distance Ls is reduced to about 0.5 μm.

Figure 4B:
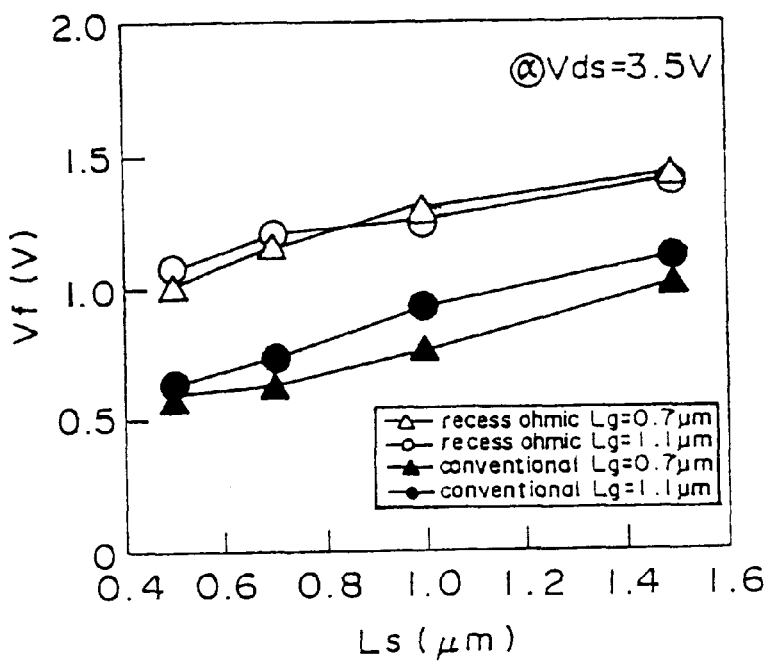

FIG. 4B shows a gate voltage Vf in which the gate leakage current leaking from the source region $39_1$ to the gate electrode becomes 0.5 μA/μm in the transistor 30 of FIG. 3, for the case in which the transistor 30 is driven with a source-drain voltage of 3.5 V. FIG. 4B shows the gate voltage Vf in comparison with that of the conventional transistor 10 of FIG. 1. In FIG. 4B, it should be noted that the horizontal axis represents the distance Ls between the source diffusion region and the gate electrode, similar to FIG. 4A.

Referring to FIG. 4B, it should be noted that the gate voltage Vf that provides the leakage current Igs of 0.5 μA/μm is increased substantially in the transistor 30 of the present invention over the conventional transistor 10, indicating a successful reduction of the leakage current in the transistor 30 of the present invention.

In the transistor 30 of FIG. 3, it should be noted that the part corresponding to the gap between the source electrode $39_1$ and the high-resistance layer 37 or the gap between the drain electrode $39_2$ and the high-resistance layer 37 is doped to form a part of the diffusion region $31_1$ or $31_2$. Further, the channel region is covered by the high-resistance layer 37, which is formed thereon epitaxially. Thus, there occurs no substantial penetration of the surface depletion region into the channel layer 33, and the construction of the transistor 30 is particularly advantageous when the transistor 30 is an enhanced-mode transistor. However, it should be noted that the present invention is by no means limited to an enhanced-mode transistor.

Second Embodiment

FIGS. 6A–6D show a part of the fabrication process of the transistor 30 of FIG. 3 according to a second embodiment of the present invention, wherein those parts corresponding to the parts described previously are designated by the same reference numerals and the description thereof will be omitted.

Figure 6A:
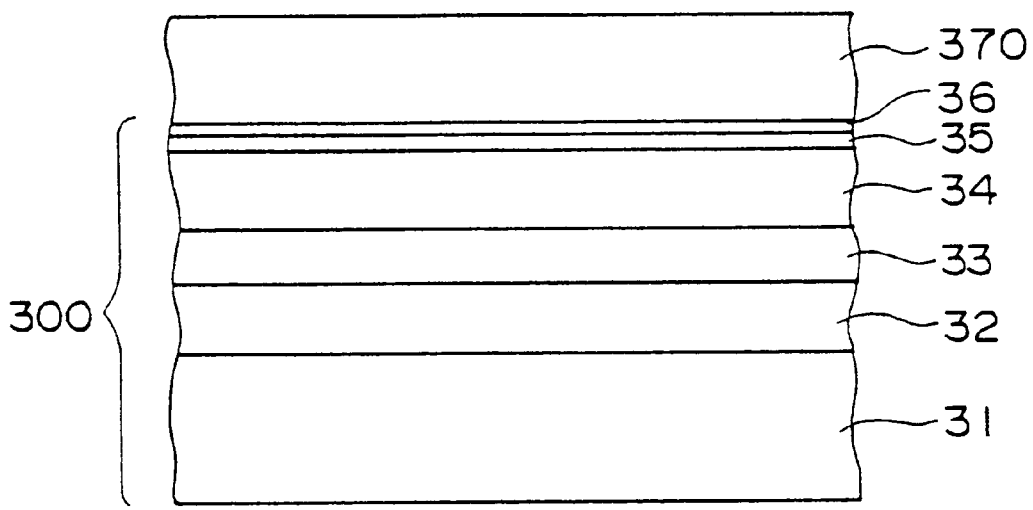
FIGS. 6A–6D are diagrams showing the fabrication process of the semiconductor device of FIG. 3 according to a first embodiment of the present invention.

Referring to FIG. 6A, the layered semiconductor body 300 is formed by depositing the semiconductor layers 32–36 on the GaAs substrate 31 similarly as described. Further, a semiconductor layer 370 of an undoped GaAs is deposited on the layered semiconductor body 300 with a thickness of typically about 150 nm. Further, in the step of FIG. 6B, a resist pattern 371 is formed on the semiconductor layer 370 by a photolithographic process.

Figure 6B:
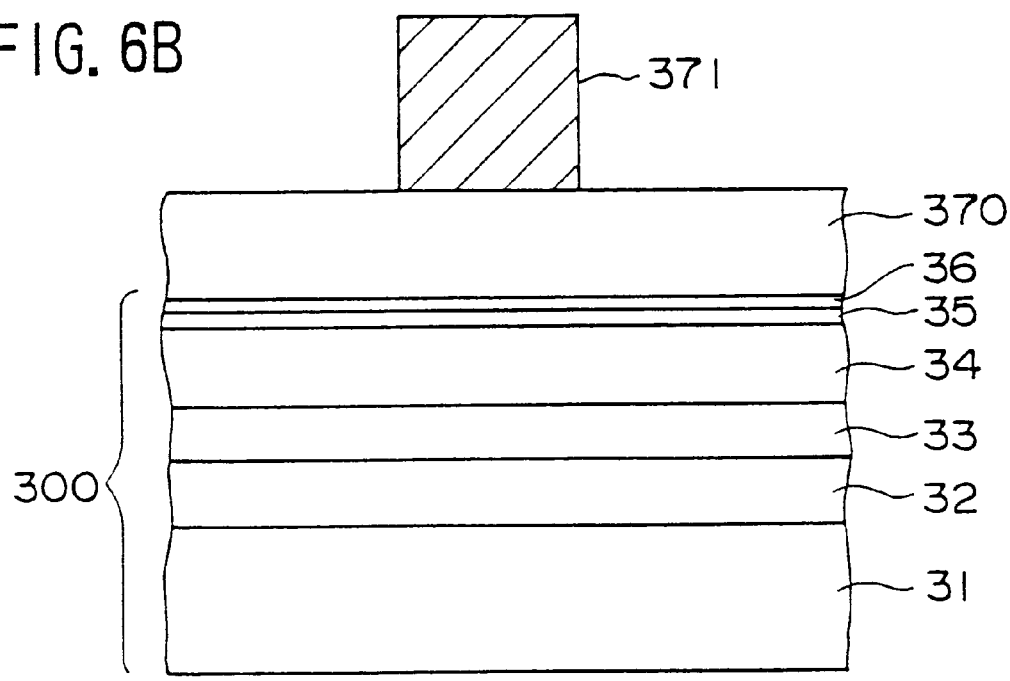
Figure 6C:
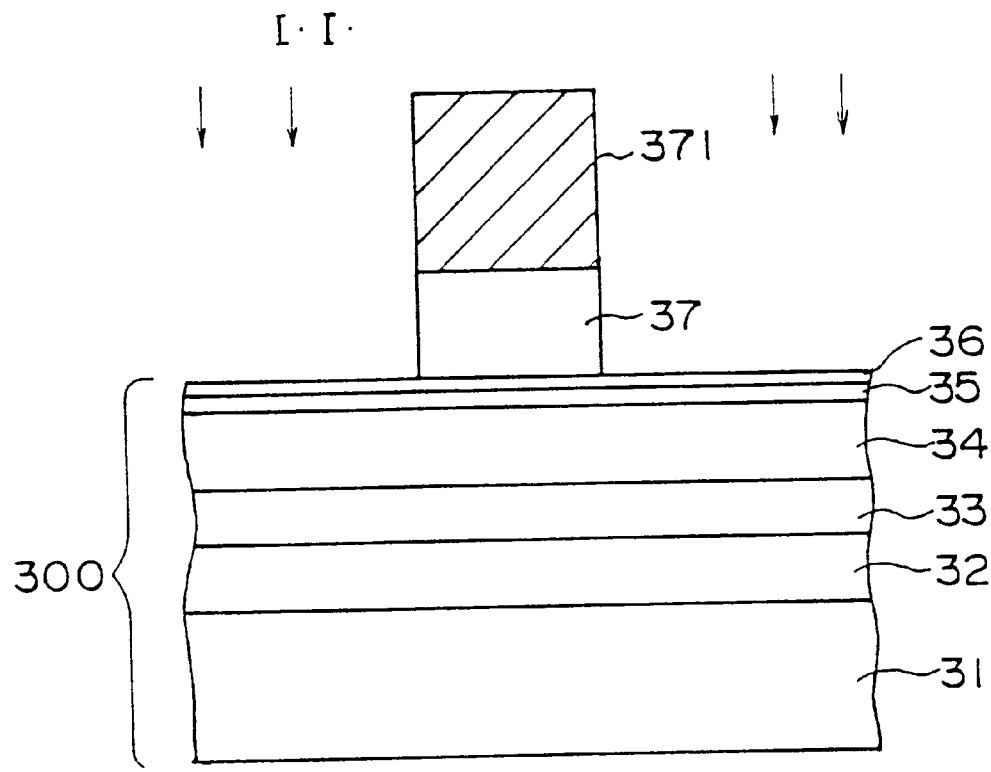

Next, in the step of FIG. 6C, the semiconductor layer 370 is subjected to a dry etching process while using the resist pattern 371 as a mask, to form the foregoing GaAs high-resistance layer 37. Further, the same resist pattern 371 is used also in the step of FIG. 6C to introduce $Si^+$ ions into the layered semiconductor structure 300 by an ion implantation process, which is typically conducted under an acceleration voltage of about 30 keV with a dose of $4 \times 10^{13} cm^{-2}$, to form the foregoing diffusion regions $31_1$ and $31_2$ as indicated in FIG. 6D.

Thereafter, the resist pattern 371 is removed and the gate electrode 38 is formed on the high-resistance layer 37 by a well known process.

In the process of FIGS. 6A–6D, the ion implantation process is conducted with a relatively low acceleration energy, and the shape of the diffusion regions $31_1$ and $31_2$ is controlled exactly. This means that it is possible to reduce the separation between the source region and the drain region of the transistor 30 to be formed without problem.

Figure 6D:
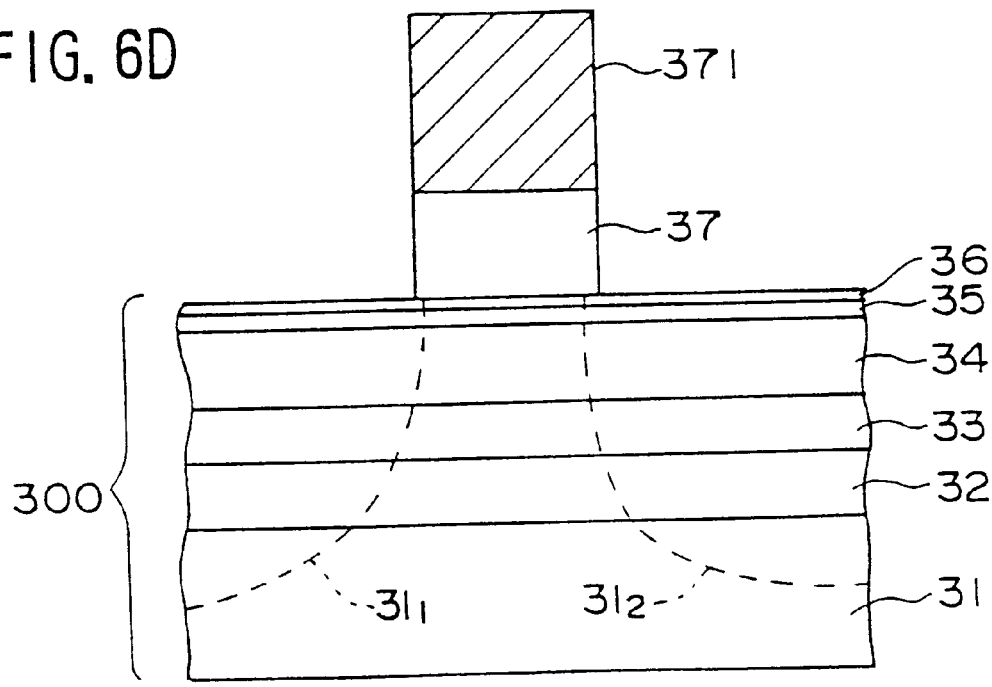

In the process of FIGS. 6A–6D, on the other hand, the thermal annealing process, which is conducted in the step of FIG. 6D after the ion implantation process (typically at 850° C. for 15 seconds), tends to cause a thermal deterioration in the channel layer 33. In the structure of FIG. 6D, it should be noted that the distance between the channel layer 33 and the surface of the layered semiconductor body 300 is reduced. Thus, it is necessary, when forming the transistor 30 according to the process of FIGS. 6A–6D, to increase the thickness of the spacer layer 35 to typically about 10 nm.

When the transistor 30 is thus formed with the spacer layer 35 having such an increased thickness, on the other hand, there is a tendency that a short-channel effect occurs when the gate length is reduced. Thus, it is generally desirable to form the transistor 30 to have a gate length of about 1 μm as long as the transistor 30 is formed according to the process of FIG. 6A–6D.

Third Embodiment

Figure 7A:
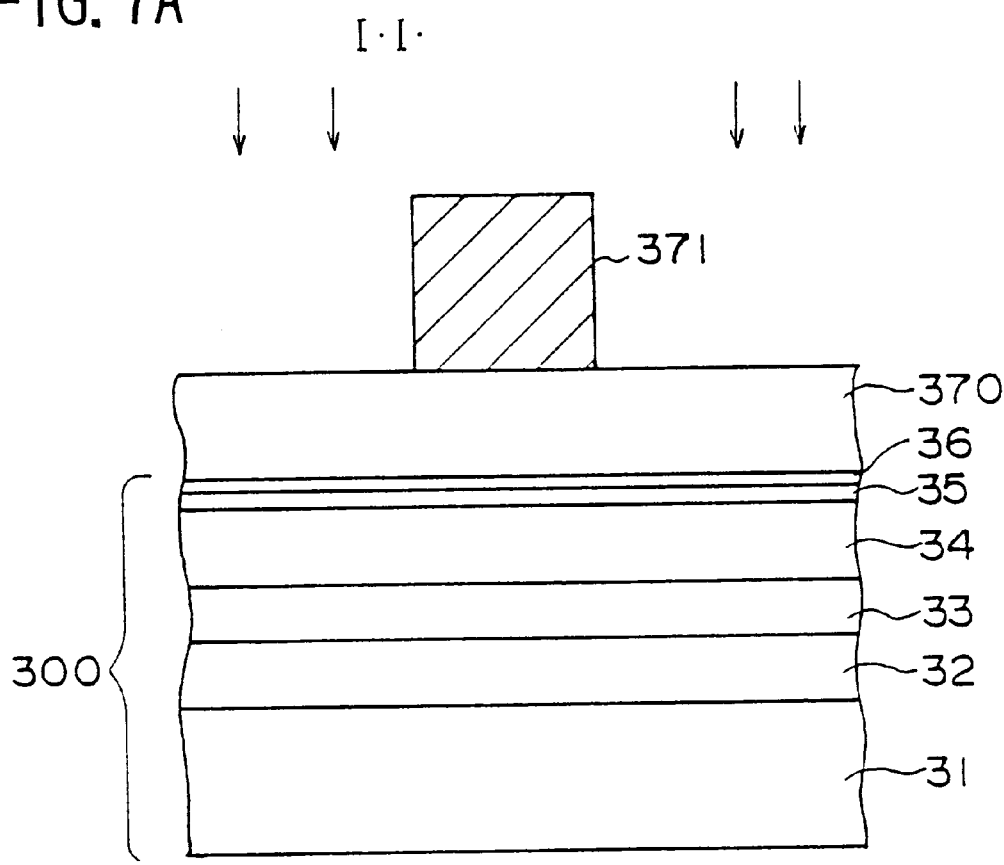
FIGS. 7A and 7B are diagrams showing the fabrication process of the semiconductor device of FIG. 3 according to a second embodiment of the present invention.
Figure 7B:
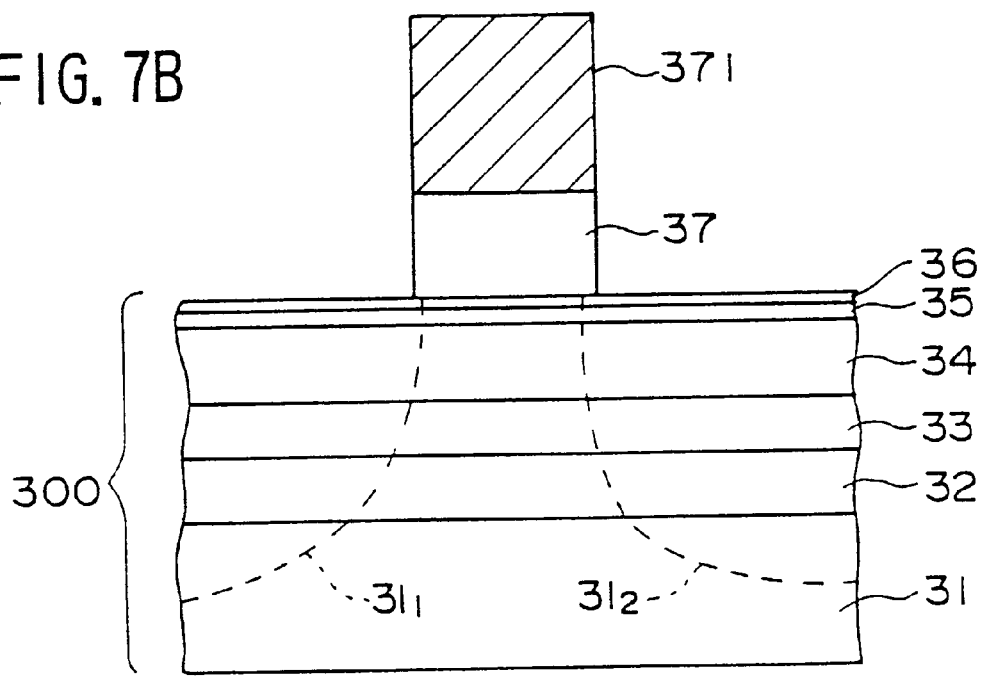

FIGS. 7A and 7B show a part of the fabrication process of the transistor 30 according to a third embodiment of the present invention, in which the order of the steps of FIGS. 6C and 6D is reversed. In FIGS. 7A and 7B, those parts corresponding to the parts described previously are designated by the same reference numerals and the description thereof will be omitted.

Referring to FIG. 7A, which is conducted immediately after the step of FIG. 6B, it should be noted that the ion implantation process of $Si^+$ is conducted through the semiconductor layer 370, on which the resist pattern 371 is formed. In this case, the thickness of the spacer layer 35 may be set to 3 nm and the ion implantation process is conducted by setting the acceleration voltage to about 200 keV.

After the ion implantation process, the resist pattern is removed and a thermal annealing process is applied to form the foregoing diffusion regions $31_1$ and $31_2$. Further, in the step of FIG. 7B, the resist pattern 371 is formed again and the semiconductor layer 370 is subjected to a dry etching process while using e resist pattern 371 as a mask, to form the foregoing high-resistance layer 37.

By forming the transistor 30 according to such a process, the thermal annealing process used for forming the diffusion regions $31_1$ and $31_2$ is conducted in the state that the layered semiconductor body 300 is covered by the semiconductor layer 370 and the problem of thermal deterioration of the channel layer 33 is effectively avoided even when the spacer layer 35 has a reduced thickness. Thus, the process of FIGS. 7A and 7B is suitable for forming a short-channel transistor which may have a gate length of about 0.25 $\mu$m.

Thus, in the present invention, the process of the second embodiment or the process of the third embodiment is selected depending upon the gate length of the transistor to be fabricated.

It should be noted that the present invention is not limited to the fabrication of a doped channel transistor but may be applicable to the fabrication of other compound-semiconductor FETs.

Fourth Embodiment

Figure 8:
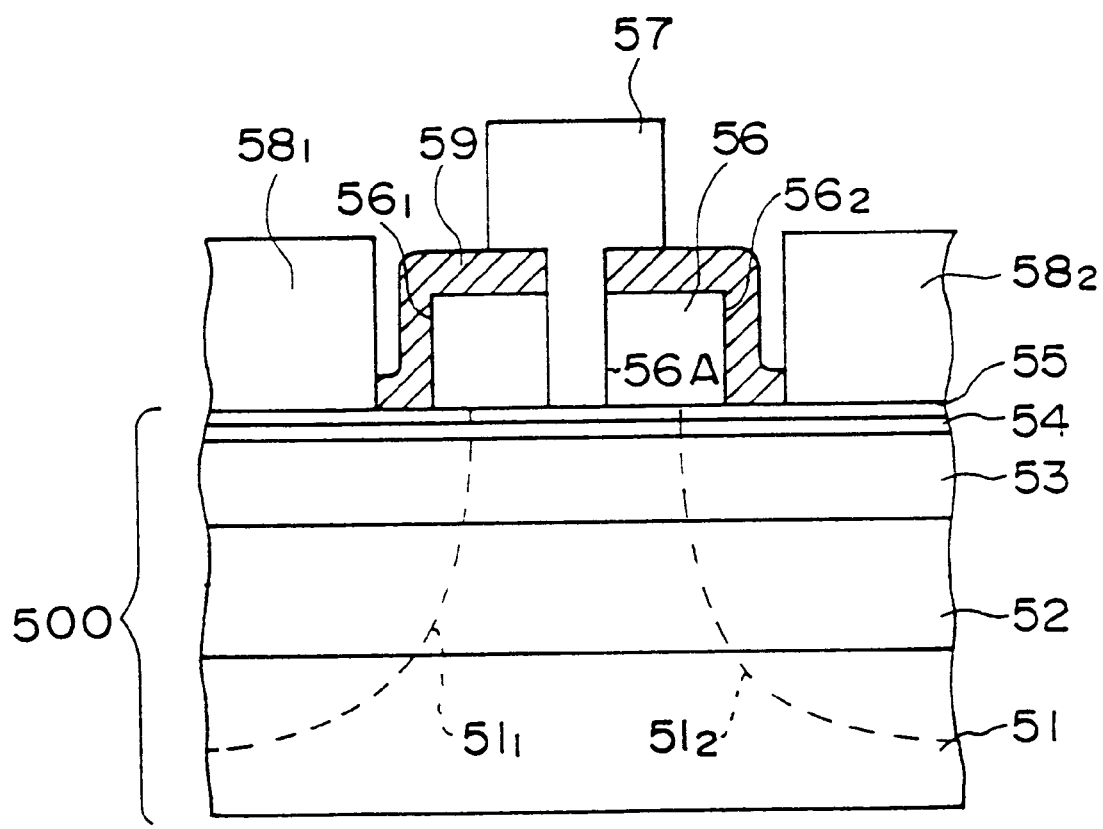
FIG. 8 is a diagram showing the construction of a MESFET according to a fourth embodiment of the present invention.

FIG. 8 shows the construction of a MESFET 50 according to a fourth embodiment of the present invention.

Referring to FIG. 8, the MESFET 50 is constructed on a semi-insulating substrate 51 of GaAs and includes a layered semiconductor body 500, wherein the layered semiconductor body 500 includes a buffer layer 52 of undoped GaAs formed on the substrate 51 epitaxially with a thickness of about 50 nm, a channel layer 53 of n-type InGaAs formed on the buffer layer 52 epitaxially with a thickness of about 15 nm, a spacer layer 54 of undoped GaAs formed on the channel layer 53 epitaxially with a thickness of about 10 nm, and an etching stopper layer 55 of undoped AlGaAs formed on the spacer layer 54 epitaxially with a thickness of about 3 nm.

Further, a high-resistance layer 56 of undoped GaAs is formed on the layered semiconductor body 500 epitaxially with a thickness of about 150 nm corresponding to a channel region of the transistor 50 to be formed. It should be noted that the InGaAs channel layer 53 has a composition of $In_{0.2}Ga_{0.8}As$ and doped to a carrier density of $7.5 \times 10^{17} cm^{-3}$, while the AlGaAs etching stopper layer 55 has a composition of $Al_{0.25}Ga_{0.75}As$.

Further, the high-resistance layer 56 is defined by a first side-wall $56_1$ and a second, opposing side-wall $56_2$, and a first n-type diffusion region $51_1$ is formed in the foregoing layered semiconductor body 500 at the region adjacent to the side-wall $56_1$ by conducting an ion-implantation process of Si. Similarly, a second n-type diffusion region $51_2$ is formed in the layered semiconductor body 500 adjacent to the second side-wall $51_2$ by an ion implantation process of Si. Thereby, the n-type diffusion region $51_1$ serves for the source region of the transistor 50 while the n-type diffusion region $51_2$ serves for the drain region of the transistor 50.

The ion implantation process of Si is conducted in each of the cases of forming the source diffusion region $51_1$ and the drain diffusion region $51_2$, such that the Si atoms thus introduced reach the substrate 51.

In the foregoing high-resistance layer 56, there is provided a contact hole 56A exposing the etching stopper layer 55 underneath, and a gate electrode 57 of Al is provided on the layer 56 such that the gate electrode 57 fills the contact hole 56A.

Further, an ohmic electrode $58_1$ having an AuGe/Ge structure is formed on the layered semiconductor body 500 in correspondence to the diffusion region $51_1$, with a separation from the side-wall $56_1$ of the high-resistance layer 56. Similarly, an ohmic electrode $58_2$ also having an AuGe/Ge structure is formed on the layered semiconductor body 500 in correspondence to the diffusion region $51_2$, with a separation from the side-wall $56_2$ of the high-resistance layer 56. Thereby, the ohmic electrode $58_1$ serves for a source electrode while the ohmic electrode $58_2$ serves for a drain electrode of the transistor 50. It should be noted that the exposed surface of the high-resistance layer, including the side-walls $56_1$ and $56_2$, are covered by an insulation film 59, which may by formed of $SiO_2$ or SiN.

In the MESFET 50, too, it should be noted that the source electrode $58_1$ is provided with a separation from the high-resistance layer 56 and the leakage current from the source electrode $58_1$ to the gate electrode 57 is effectively suppressed.

Fifth Embodiment

Figure 9:
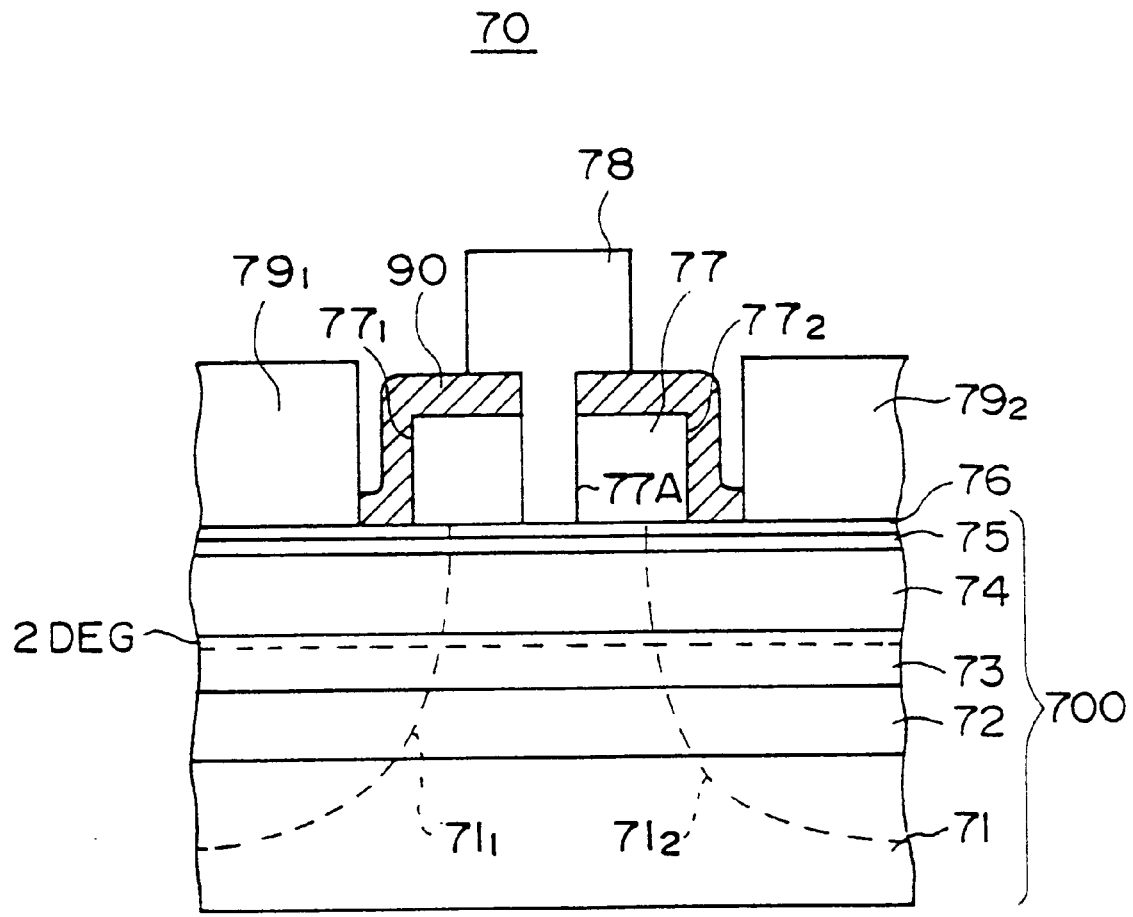
FIG. 9 is a diagram showing the construction of a HEMT according to a fifth embodiment of the present invention.

FIG. 9 shows the construction of a HEMT 70 according to a fifth embodiment of the present invention.

Referring to FIG. 9, the HEMT 70 is constructed on a semi-insulating substrate 71 of GaAs and includes a layered semiconductor body 700, wherein the layered semiconductor body 700 includes a buffer layer 72 of undoped GaAs formed on the substrate 71 epitaxially with a thickness of about 50 nm, a channel layer 73 of undoped InGaAs formed on the buffer layer 72 epitaxially with a thickness of about 15 nm, an electron-supplying layer 74 of n-type AlGaAs formed on the channel layer 73 epitaxially with a thickness of about 20 nm, a spacer layer 75 of undoped GaAs formed on the electron-supplying layer 74 epitaxially with a thickness of about 10 nm, and an etching stopper layer 76 of undoped AlGaAs formed on the spacer layer 75 epitaxially with a thickness of about 3 nm.

Further, a high-resistance layer 77 of undoped GaAs is formed on the layered semiconductor body 700 epitaxially with a thickness of about 150 nm in correspondence to a channel region of the transistor 70 to be formed. It should be noted that the InGaAs channel layer 73 has a composition of $In_{0.2}Ga_{0.8}As$, while the AlGaAs electron-supplying layer is doped to a carrier density of $2 \times 10^{18} cm^{-3}$. Further, the etching stopper layer 76 has a composition of $Al_{0.25}Ga_{0.75}As$. In the structure of FIG. 9, a two-dimensional electron gas 2DEG is formed in the channel layer 73 along an interface to the electron-supplying layer 74 as a result of the junction of the channel layer 73 and the electron-supplying layer 74, as is well known in the art.

Further, the high-resistance layer 77 is defined by a first side-wall $77_1$ and a second, opposing side-wall $77_2$, and a first n-type diffusion region $71_1$ is formed in the foregoing layered semiconductor body 700 at the region adjacent to the side-wall $77_1$ by conducting an ion-implantation process of Si. Similarly, a second n-type diffusion region $71_2$ is formed in the layered semiconductor body 700 adjacent to the second side-wall $71_2$ by an ion implantation process of Si. Thereby, the n-type diffusion region $71_1$ serves for the source region of the transistor 70 while the n-type diffusion region $71_2$ serves for the drain region of the transistor 70. The ion implantation process of Si is conducted in each of the cases of forming the source diffusion region $71_1$ and the drain diffusion region $71_2$, such that the Si atoms thus introduced reach the substrate 71.

In the foregoing high-resistance layer 77, there is provided a contact hole 77A exposing the etching stopper layer 76 underneath, and a gate electrode 78 of Al is provided on the layer 77 such that the gate electrode 78 fills the contact hole 77A.

Further, an ohmic electrode $79_1$ having an AuGe/Ge structure is formed on the layered semiconductor body 700 in correspondence to the diffusion region $71_1$, with a separation from the side-wall $77_1$ of the high-resistance layer 77. Similarly, an ohmic electrode $79_2$ also having an AuGe/Ge structure is formed on the layered semiconductor body 700 in correspondence to the diffusion region $71_2$, with a separation from the side-wall $77_2$ of the high-resistance layer 77. Thereby, the ohmic electrode $79_1$ serves for a source electrode while the ohmic electrode $79_2$ serves for a drain electrode of the transistor 50. It should be noted that the exposed surface of the high-resistance layer 77, including the side-walls $77_1$ and $77_2$, are covered by an insulation film 80, which may by formed of $SiO_2$ or SiN.

In the MESFET 70, too, it should be noted that the source electrode $79_1$ is provided with a separation from the high-resistance layer 77 and the leakage current from the source electrode $79_1$ to the gate electrode 78 is effectively suppressed.

Figure 10:
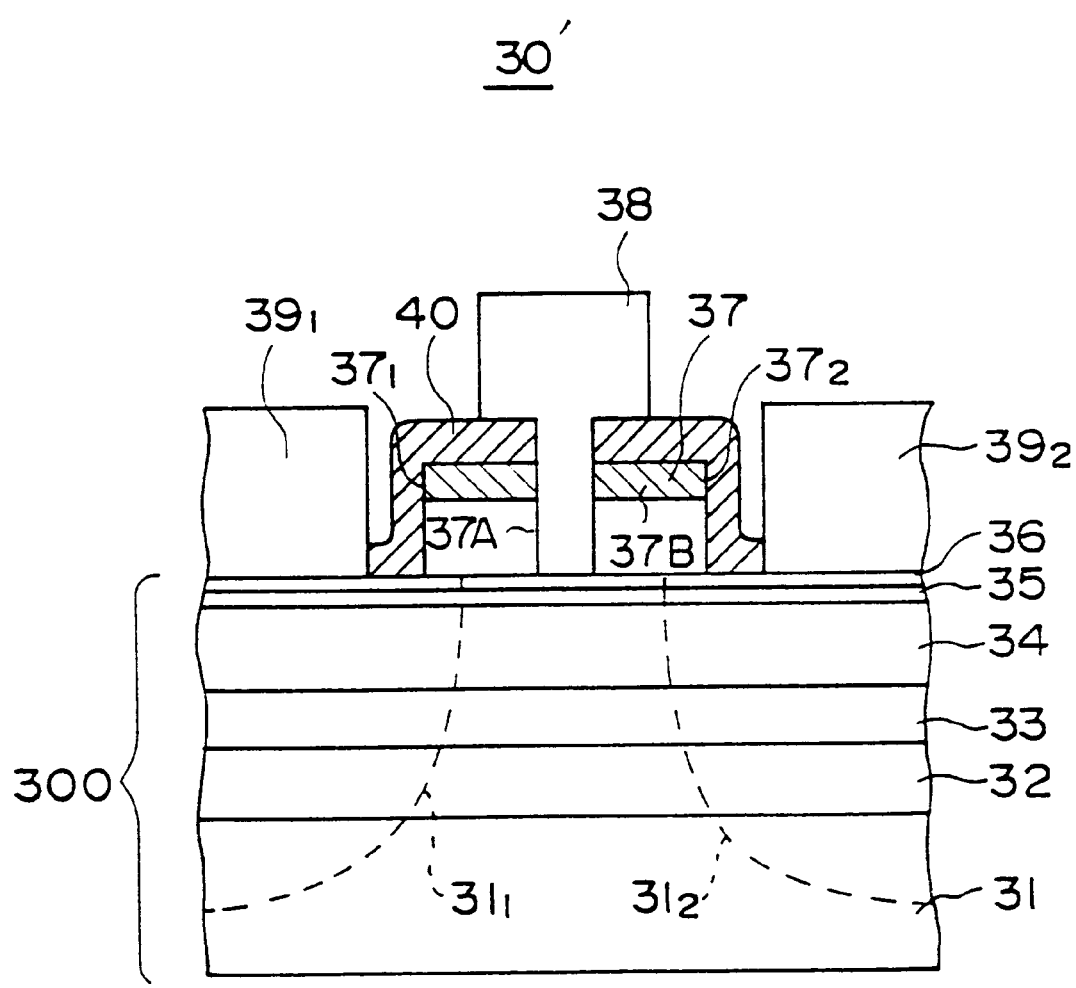
FIG. 10 is a diagram showing a modification of the doped-channel transistor of FIG. 3.

FIG. 10 shows the construction of a transistor 30' which is a modification of the doped-channel transistor of FIG. 3, wherein those parts corresponding to the parts described previously are designated by the same reference numerals and the description will be omitted.

Referring to FIG. 10, the transistor 30' is substantially identical to the transistor 30 described previously, except that a surface 37B of the high-resistance layer 37 is doped to the n-type. By doing so, the depletion region penetrating to the channel layer 33 is reduced further and the performance of the enhancement-mode transistor is improved further.

Further, the present invention is not limited to the embodiments described heretofore, but various variations and modifications may be made without departing from the scope of the invention.

What is claimed is:

1. A field-effect transistor, comprising:
 a channel layer transporting carriers therethrough;
 a source electrode injecting carriers into said channel layer;
 a drain electrode collecting carriers from said channel layer;
 a high-resistance layer provided on said channel layer between said source electrode and said drain electrode, said high-resistance layer including an opening in said high-resistance layer; and
 a gate electrode provided in said opening,
 said high-resistance layer being defined by a first side-wall facing said source electrode and a second side-wall facing said drain electrode,
 wherein at least said first side-wall is formed with a separation from said source electrode, and
 wherein said high-resistance layer is formed on the channel layer in an epitaxial relationship.

2. A field-effect transistor as claimed in claim 1, wherein said second side-wall is separated from said drain electrode.

3. A field-effect transistor as claimed in claim 1, wherein said high-resistance layer is formed on the channel layer with an epitaxial relationship.

4. A field-effect transistor as claimed in claim 1, wherein said channel layer includes first and second diffusion regions respectively corresponding to said source electrode and drain electrode such that said source electrode achieves an ohmic contact with said first diffusion region and such that said drain electrode achieves an ohmic contact with said second diffusion region, said first diffusion region extending in said channel layer over a region between said source electrode and first side-wall, said second diffusion region extending in said channel layer over a region between said drain electrode and said second side-wall.

5. A field-effect transistor as claimed in claim 1, wherein said channel layer carries thereon a barrier layer having a bandgap larger than a bandgap of said channel layer, and wherein said high-resistance layer is formed on said barrier layer epitaxially, said barrier layer being formed in an epitaxial relationship with said channel layer.

6. A field-effect transistor as claimed in claim 5, wherein said channel layer includes a dopant element having a polarity identical to a polarity of carriers passing therethrough, and wherein said barrier layer is substantially free from dopant elements.

7. A field-effect transistor as claimed in claim 5, wherein said channel layer includes a dopant element having a polarity identical to a polarity of carriers passing therethrough, and wherein said high-resistance layer is substantially free from dopant elements except for a surface part thereof.

8. A field-effect transistor as claimed in claim 5, wherein said channel layer is substantially free from dopant elements, and wherein said barrier layer contains a dopant element having a polarity identical to a polarity of carriers passing through said channel layer, said channel layer thereby including a two-dimensional carrier gas along an interface to said barrier layer.

9. A field-effect transistor as claimed in claim 1, wherein said channel layer contains a dopant element having a polarity of carriers passing therethrough.

* * * * *